US008677201B2

(12) United States Patent
Itou

(10) Patent No.: US 8,677,201 B2
(45) Date of Patent: Mar. 18, 2014

(54) SEMICONDUCTOR INTEGRATED CIRCUIT AND METHOD OF RETRIEVING SIGNAL TO SEMICONDUCTOR INTEGRATED CIRCUIT

(75) Inventor: Hiroaki Itou, Tokyo (JP)

(73) Assignee: Lapis Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 13/494,462

(22) Filed: Jun. 12, 2012

(65) Prior Publication Data

US 2012/0331358 A1 Dec. 27, 2012

(30) Foreign Application Priority Data

Jun. 23, 2011 (JP) .................................. 2011-139593

(51) Int. Cl.
*G01R 31/3177* (2006.01)
*G01R 31/40* (2006.01)

(52) U.S. Cl.
USPC .......................................... 714/726; 714/733

(58) Field of Classification Search
None
See application file for complete search history.

(56) References Cited

U.S. PATENT DOCUMENTS

| 6,442,722 | B1 * | 8/2002 | Nadeau-Dostie et al. ..... 714/731 |
| 7,945,833 | B1 * | 5/2011 | Wang et al. .................... 714/729 |
| 2010/0332924 | A1 * | 12/2010 | Ziaja et al. ..................... 714/718 |

FOREIGN PATENT DOCUMENTS

| JP | 2009-036668 A | 2/2009 |
| JP | 2010-197291 A | 9/2010 |

* cited by examiner

*Primary Examiner* — Ajay Bhatia
*Assistant Examiner* — Dipakkumar Gandhi
(74) *Attorney, Agent, or Firm* — Kubotera & Associates, LLC

(57) ABSTRACT

A semiconductor integrated circuit is configured so that a transition scan test can be performed thereon. The semiconductor integrated circuit includes a plurality of logic circuit blocks having different operation frequencies; a clock supply unit for supplying a plurality of clock signals having frequencies corresponding to the operation frequencies of the logic circuit blocks from a clock supply source; a compression scan circuit including a plurality of scan chains formed of a plurality of flip-flop circuits, a pattern deployment circuit connected to the scan chains on an input side thereof, and a pattern compression circuit; and a clock control unit for controlling the clock supply unit to stop supplying the clock signals to specific ones of the flip-flop circuits of the scan chains when a capture operation is performed during a transition scan test.

7 Claims, 4 Drawing Sheets

US 8,677,201 B2

SEMICONDUCTOR INTEGRATED CIRCUIT AND METHOD OF RETRIEVING SIGNAL TO SEMICONDUCTOR INTEGRATED CIRCUIT

BACKGROUND OF THE INVENTION AND RELATED ART STATEMENT

The present invention relates to a semiconductor integrated circuit. More specifically, the present invention relates to a semiconductor integrated circuit capable of performing a transition scan test.

In recent years, a semiconductor integrated circuit has been operated at a higher speed, and the semiconductor integrated circuit has been integrated more progressively. Along with this trend, it has been required to perform an inspection and an operation evaluation on the semiconductor integrated circuit thus produced in a shorter period of time. An evaluation method of the semiconductor integrated circuit includes a scan test.

FIG. 4 is a block diagram showing a conventional scan circuit 100 for performing the scan test. As shown in FIG. 4, the conventional scan circuit 100 includes scan flip-flop circuits (scan FFs) 103a to 103d substituting flip-flop circuits (D-FFs) in the semiconductor integrated circuit. Each of the scan FFs 103a to 103d includes a scan input terminal SD and a scan output terminal Q. In the conventional scan circuit 100, the scan output terminal Q of one of the scan FFs 103a to 103d disposed at a front stage is connected to the scan input terminal SD of another of the scan FFs 103a to 103d disposed at a later stage, thereby constituting a scan path.

More specifically, as shown in FIG. 4, each of the scan FFs 103a to 103d further includes a data input terminal D, so that a multiplexer MUX is disposed at the data input terminal D. Further, the multiplexer MUX includes the scan input terminal SD, so that data can be directly input to each of the scan FFs 103a to 103d. Further, the multiplexer MUX includes a selection terminal SS (also referred to as a scan enable terminal), so that the data input terminal D in a normal operation and the scan input terminal SD can be switched. It is noted that the scan output terminal Q of each of the scan FFs 103a to 103d collectively becomes a data output terminal in the normal operation.

In the conventional scan circuit 100, the scan FFs 103a to 103d are connected (constituting a scan chain), and the scan enable terminal SS of each of the scan FFs 103a to 103d is controlled, thereby making a shift register operation possible. Accordingly, it is possible to evaluate a sequence circuit as a combination circuit 100.

More specifically, when the data input terminal D of each of the scan FFs 103a to 103d is selected through a scan enable signal, each of the scan FFs 103a to 103d captures a value from the combination circuit 101 (referred to as a capture operation). When the scan input terminal SD of each of the scan FFs 103a to 103d is selected through the scan enable signal, each of the scan FFs 103a to 103d performs a shift operation (referred to as a scan shift operation).

One single semiconductor integrated circuit may have a plurality of blocks operating at clocks having different frequencies. Patent Reference 1 has disclosed a technology for performing a data transfer test between such blocks at an actual speed. In the technology disclosed in Patent Reference 1, a reference clock and a frequency division clock are generated. The frequency division clock is generated through dividing a frequency of the reference clock in half.

Patent Reference 2 has disclosed a scan test for evaluating the semiconductor integrated circuit. In the scan test disclosed in Patent Reference 2, a plurality of clock signals having at least one of a different frequency and a different phase is used.

Patent Reference 1: Japanese Patent Publication No. 2009-36668
Patent Reference 2: Japanese Patent Publication No. 2010-197291

FIG. 5 is a schematic diagram showing a conventional compression scan circuit 200 for reducing a test time of the scan test. As sown in FIG. 5, the conventional compression scan circuit 200 includes a plurality of scan input terminals 211, scan chains 207, multiplexers 217, and a pattern deployment circuit 201. Each of the scan chains 207 is formed of scan FFs 205 arranged at a plurality of stages (for example, five stages). The pattern deployment circuit 201 is configured such that the scan input terminals 211 are connected to the scan chains 207 through the multiplexers 217. During the scan shift operation, the scan input terminals connected to the scan chains 207 are dynamically switched.

Further, the conventional compression scan circuit 200 includes scan output terminals 213, exclusive logic sum gates 219, and a pattern compression circuit 203. The pattern compression circuit 203 is configured such that the scan chains 207 are connected to the scan output terminals 213 through the exclusive logic sum gates 219.

It is noted that a majority of the scan test time corresponds to a period of time consumed for the scan shift operation. When the conventional compression scan circuit 200 shown in FIG. 5 is used for performing the scan test, it is possible to reduce the number of the stages of the scan flip-flop circuits of the scan chains 207. Accordingly, it is possible to reduce the scan shift time, thereby reducing the scan test time.

FIG. 7 is a block diagram showing a semiconductor integrated circuit subject to the conventional scan test. As shown in FIG. 7, the semiconductor integrated circuit includes a frequency division circuit 301, high speed clock flip-flop circuits 305 operating at a high speed clock, and low speed clock flip-flop circuits 307 operating at a low speed clock. When the semiconductor integrated circuit is tested in the conventional scan test, it is necessary to directly control the clock of the scan FFs from outside.

More specifically, when the semiconductor integrated circuit shown in FIG. 7 includes the frequency division circuit 301, it is difficult to perform the scan test on the semiconductor integrated circuit. Accordingly, when the scan test is performed, it is necessary to bypass the frequency division circuit 301.

Further, when it is necessary to supply clocks having different frequencies for the scan test, it is necessary to separately supply the clocks from outside. However, due to the restriction in the number of electrode pads of the semiconductor integrated circuit or the number of the terminals of the semiconductor integrated circuit, it is difficult to provide a configuration for separately supplying such clocks from outside.

On the other hand, when the high speed clock flip-flop circuits 305 are tested, the low speed clock flip-flop circuits 307 are operated without compensation. Accordingly, when the clocks having the different frequencies are supplied to one single clock terminal for performing the transition scan test, it is necessary to mask an expected value of the scan FFs.

As shown in FIG. 5, the pattern compression circuit 203 is formed of the exclusive logic sum gates 219. Accordingly, when the compression scan is applied at the same time, if the expected value of the scan FFs of the low speed clock flip-flop circuits 307 is masked, the expected value of the scan FFs of the high speed clock flip-flop circuits 305, which are arranged at the same stage as other scan chains, is masked. As a result, it is difficult to accurately detect malfunction in the compression scan test.

FIG. 6 is a schematic diagram showing the conventional compression scan circuit 200 in a compression bypass mode. As shown in FIG. 6, in the compression bypass mode, the pattern deployment circuit 201 and the pattern compression circuit 203 are bypassed for detecting a malfunction when such a malfunction is not detected in the compression scan test. In the compression bypass mode, the number of the stages of the scan FFs increases, thereby increasing the test time of the transition scan test.

In view of the problems described above, an object of the present invention is to provide a semiconductor integrated circuit capable of solving the problems of the conventional semiconductor integrated circuit. In the present invention, it is possible to accurately detect a transitional malfunction occurring in a logic circuit and the like disposed in the semiconductor integrated circuit in a short period of time.

Further objects and advantages of the invention will be apparent from the following description of the invention.

SUMMARY OF THE INVENTION

In order to attain the objects described above, according to an aspect of the present invention, a semiconductor integrated circuit is configured such that a transition scan test can be performed thereon. The semiconductor integrated circuit includes a plurality of logic circuit blocks having different operation frequencies, so that the transition scan test can be performed on the semiconductor integrated circuit.

According to the aspect of the present invention, the semiconductor integrated circuit further includes a clock supply unit; a compression scan circuit; and a clock control unit.

According to the aspect of the present invention, in the semiconductor integrated circuit, the clock supply unit is provided for supplying a plurality of clock signals having frequencies corresponding to the operation frequencies of the logic circuit blocks from a clock supply source.

According to the aspect of the present invention, in the semiconductor integrated circuit, the compression scan circuit includes a plurality of scan chains; a pattern deployment circuit; and a pattern compression circuit.

According to the aspect of the present invention, in the compression scan circuit, the scan chains are formed of a plurality of flip-flop circuits operating when the flip-flop circuits receives the clock signals corresponding to the operation frequencies of the logic circuit blocks from the clock supply unit. In the flip-flop circuits, a data output terminal of one of the flip-flop circuits disposed at a front stage is connected to a scan data input terminal of another of the flip-flop circuits disposed at a later stage. Accordingly, is it possible to switch between a scan shift operation and a capture operation of the flip-flop circuits.

According to the aspect of the present invention, in the compression scan circuit, the pattern deployment circuit is connected to the scan chains on an input side thereof. Further, the pattern compression circuit is connected to the scan chains on an output side thereof.

According to the aspect of the present invention, in the compression scan circuit, data output terminals of the flip-flop circuits of the scan chains are connected to signal input terminals of the logic circuit blocks. Further, signal output terminals of the logic circuit blocks are connected to data input terminals of other flip-flop circuits of the scan chains.

According to the aspect of the present invention, in the semiconductor integrated circuit, the clock control unit is provided for controlling the clock supply unit to stop supplying the clock signals to specific ones of the flip-flop circuits of the scan chains when the capture operation is performed during the transition scan test.

In the aspect of the present invention, it is possible to accurately detect a transitional malfunction occurring in a logic circuit and the like disposed in the semiconductor integrated circuit in a short period of time.

DETAILED DESCRIPTION OF PREFERRED EMBODIMENTS

Hereunder, preferred embodiments of the present invention will be explained with reference to the accompanying drawings.

Figure 1:
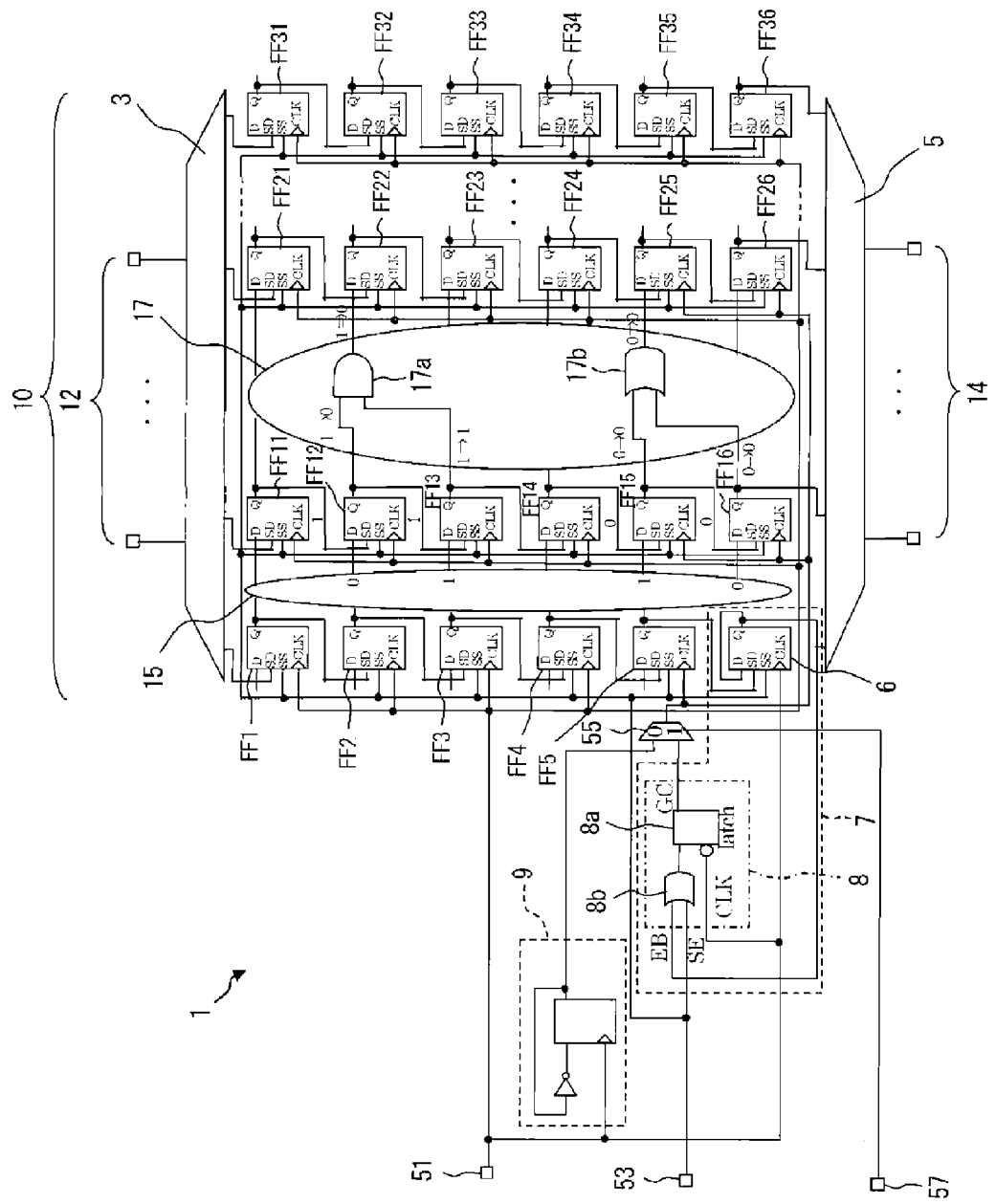
FIG. 1 is a block diagram showing a configuration of a semiconductor integrated circuit according to an embodiment of the present invention.

FIG. 1 is a block diagram showing a configuration of a semiconductor integrated circuit 1 according to an embodiment of the present invention.

As shown in FIG. 1, the semiconductor integrated circuit 1 includes a compression scan circuit 10 for performing a scan test; a transition scan clock control circuit 7; and a frequency division circuit 9. The compression scan circuit 10 is provided for performing a scan test. The transition scan clock control circuit 7 is provided for performing a specific clock control when the compression scan circuit 10 performs a transition scan test. The frequency division circuit 9 is provided for dividing a frequency of a reference operation clock (CLK) of the semiconductor integrated circuit 1.

In the embodiment, the compression scan circuit 10 includes scan chains; a combination circuit 15; a combination circuit 17; a pattern deployment circuit 3; and a pattern compression circuit 5. The scan chains are formed of a plurality of scan flip-flop circuits FF1 to FF36 (scan FFs) arranged at a plurality of stages (six stages in the embodiment) and connected in series (serial connection). The combination circuits 15 and 17 are configured to become a test subject and output a specific signal relative to an input signal from the scan FFs FF1 to FF36.

Figure 5:
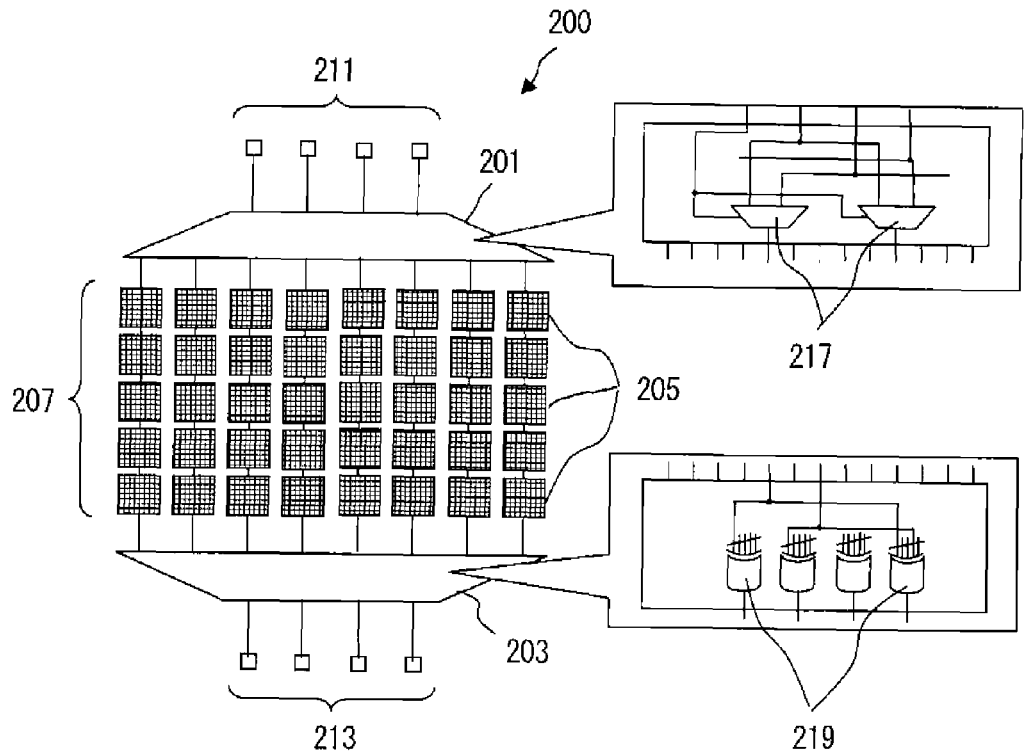
FIG. 5 is a schematic diagram showing a conventional compression scan circuit for reducing a test time of the scan test.
Figure 6:
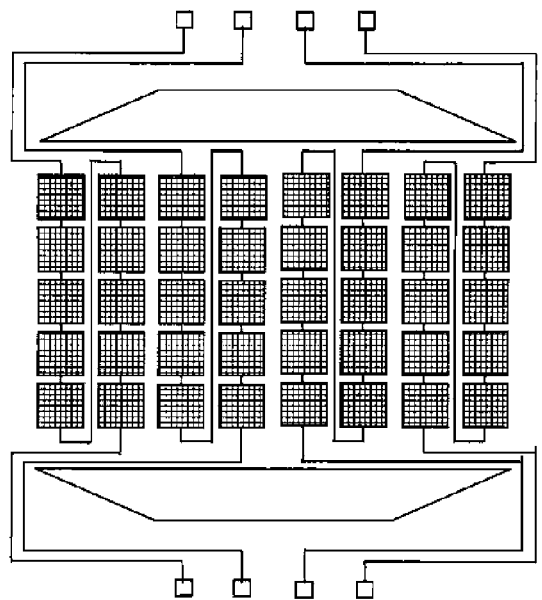
FIG. 6 is a schematic diagram showing the configuration of the conventional compression scan circuit in a compression bypass mode.
Figure 7:
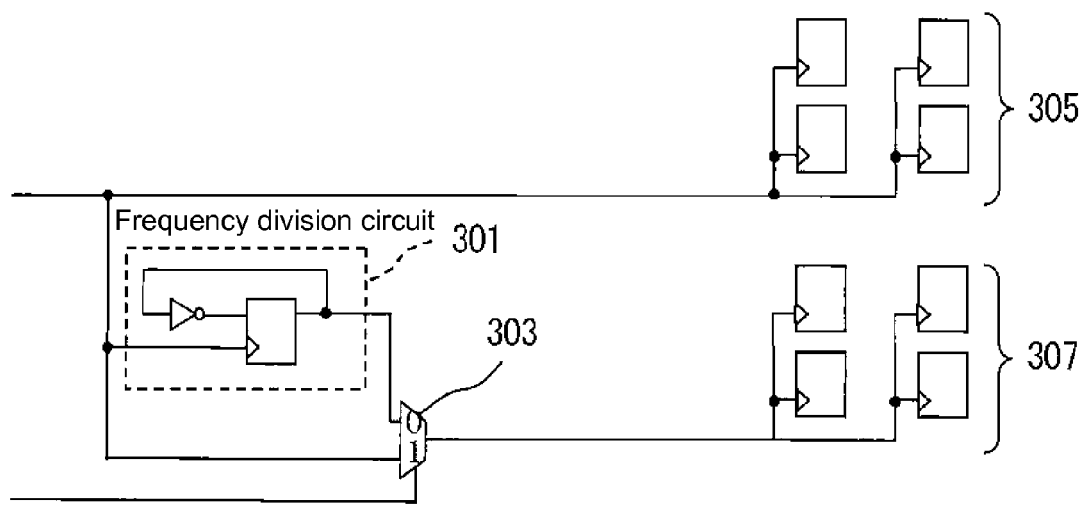
FIG. 7 is a block diagram showing a configuration of a conventional semiconductor integrated circuit subject to a conventional scan test.

In the embodiment, the pattern deployment circuit 3 is provided for connecting a plurality of scan input terminals 12 to the scan FFs FF1 to FF36 through multiplexers. The pattern compression circuit 5 is provided for connecting an output from the scan chains to a plurality of scan output terminals 14 through exclusive logic sum (EX-OR) gates. It is noted that the pattern deployment circuit 3 and the pattern compression circuit 5 have configurations similar to those of the pattern deployment circuit 201 and the pattern compression circuit 203 shown in FIG. 5, and detailed configurations are not shown. In the semiconductor integrated circuit 1 shown in FIG. 1, for the sake of simple illustration, a series of scan FFs and corresponding combinations circuits are omitted between the scan FFs FF21 to FF26 and the scan FFs FF31 to FF36.

In the embodiment, the semiconductor integrated circuit 1 is designed of, for example, a synchronizing circuit type. More specifically, a clock generation unit (not shown) generates a clock signal CLK, and the scan flip-flop circuits FF1 to FF36 shear the clock signal CLK. Further, the combination circuit 15 and the combination circuit 17 are disposed between the scan flip-flop circuits FF1 to FF36, so that the scan flip-flop circuits FF1 to FF36, the combination circuit 15, and the combination circuit 17 are configured to operate synchronizing with the clock signal CLK.

In the embodiment, in the semiconductor integrated circuit 1 shown in FIG. 1, among the scan flip-flop circuits FF1 to FF36, the scan FFs FF1 to FF4, FF11 to FF14, FF21 to FF24, and FF31 to FF36 are configured to be the scan flip-flop circuits belonging to a high speed clock group, which operates at a high speed clock (for example, 10 MHz). On the other hand, the scan FFs FF5, FF15, FF16, FF 25 and FF26 are configured to be the scan flip-flop circuits belonging to a low speed clock group, which operates at a low speed clock (for example, 5 MHz). Further, the combination circuit 15 and the combination circuit 17 are configured to be a logic circuit block formed of a plurality of logic elements such as, for example, an AND gate, an OR gate, an inverter, and the like.

Figure 2:
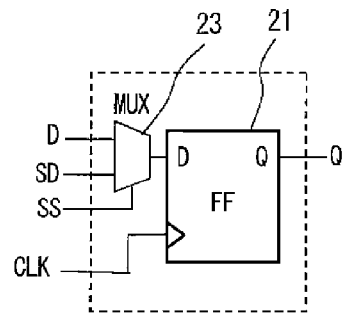
FIG. 2 is a block diagram showing a configuration of a flip-flop circuit of the semiconductor integrated circuit according to the embodiment of the present invention.

A configuration of the flip-flop circuit will be explained next. FIG. 2 is a block diagram showing the configuration of the flip-flop circuit of the semiconductor integrated circuit 1 according to the embodiment of the present invention.

As shown in FIG. 2, each of the scan flip-flop circuits FF1 to FF36 is formed of a D flip-flop circuit (D-FF) having a clock input terminal CLK and a data input terminal D. The data input terminal D is connected to a multiplexer (MUX) 23 configured to function as a selector. The MUX 23 includes a data input terminal D for inputting data in a normal operation, and a scan input terminal SD for inputting data to the flip-flop circuit from outside. Further, the MUX 23 includes a selection terminal (a scan enable terminal) SS for switching the data input terminal D during the normal operation and the scan input terminal SD.

In the embodiment, each of the scan flip-flop circuits FF1 to FF36 further includes a scan output terminal Q arranged to be a data output terminal in the normal operation, so that the scan flip-flop circuits FF1 to FF36 are mutually connected in series. More specifically, the scan output terminal Q of the scan FF disposed at a front stage is sequentially connected to the scan input terminal SD of the scan FF arranged at a later stage. Accordingly, the scan flip-flop circuits FF1 to FF36 constitute a shift register (the scan chain).

In the embodiment, the transition scan clock control circuit 7 includes a clock gating cell (CG) 8 formed of a latch circuit 8a and an OR gate 8b, and a clock control flip-flop circuit (FFC) 6. When the transition scan test is performed on the semiconductor integrated circuit 1, the transition scan clock control circuit 7 is configured to perform the clock control (described later).

Figure 3:
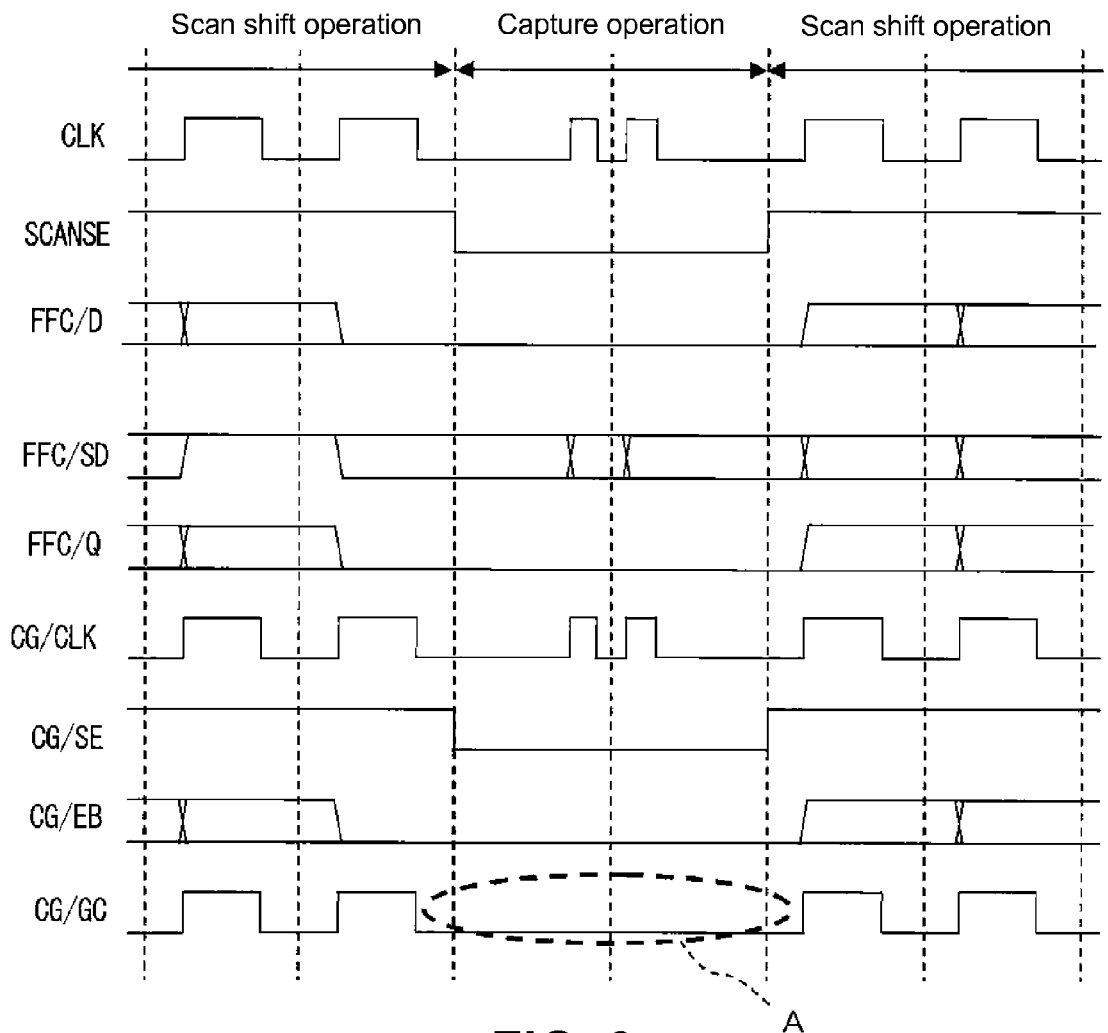
FIG. 3 is a time chart showing an operation of the semiconductor integrated circuit in a transition scan operation according to the embodiment of the present invention.
Figure 4:
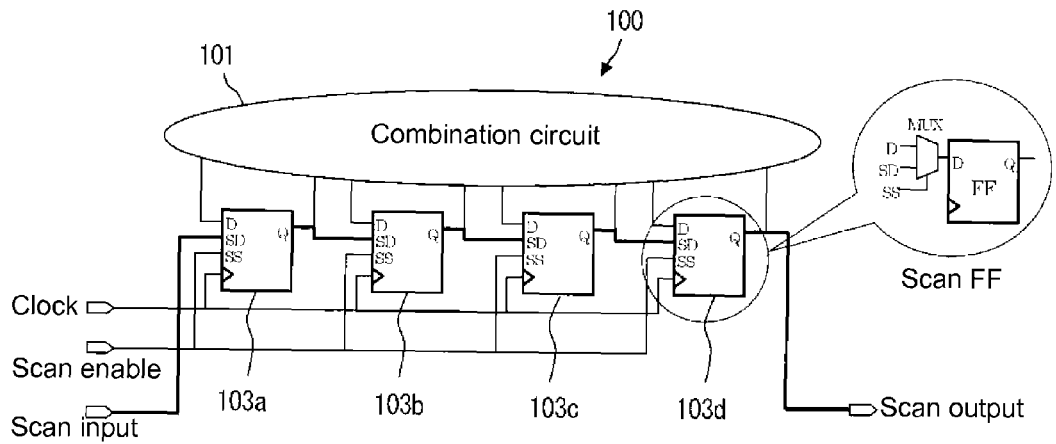
FIG. 4 is a block diagram showing a configuration of a conventional scan circuit for performing a scan test.

An operation of the semiconductor integrated circuit 1 in a transition scan operation will be explained next. FIG. 3 is a time chart showing the operation of the semiconductor integrated circuit 1 in the transition scan operation according to the embodiment of the present invention.

When the scan test is performed on the semiconductor integrated circuit 1, first, a scan mode signal (having a logic level "1" in this case) is input into a selector 55 (refer to FIG. 1) through a scan mode terminal 57 (refer to FIG. 1). Further, a scan enable signal (having a logic level "1" in this case) is input into a scan enable terminal 53 (refer to FIG. 1). As a result, the select terminals (the scan enable terminals) SS of all of the scan flip-flop circuits FF1 to FF36 become the logic level "1", so that the semiconductor integrated circuit 1 is set in the scan shift operation mode.

When the scan enable terminal 53 becomes the logic level "1", the clock signal CLK input into the transition scan clock control circuit 7 passes through the latch circuit 8a and the selector 55, and is input into the scan flip-flop circuits FF5, FF15, FF16, FF 25 and FF26 belonging to the low speed clock group. It is noted that the clock signal CLK is directly input into the scan flip-flop circuits FF1 to FF4, FF11 to FF14, FF21 to FF24, and FF31 to FF36 belonging to the high speed clock group. Accordingly, when the scan enable terminal 53 becomes the logic level "1", the clock signal CLK is input into all of the scan flip-flop circuits FF1 to FF36.

In the next step, a scan test signal is input into the scan input terminals 12 of the compression scan circuit 10. Accordingly, the clock signal CLK starts, so that the scan flip-flop circuits FF1 to FF36 perform the shift register operation.

More specifically, at this moment, the select terminals (the scan enable terminals) SS of all of the scan flip-flop circuits FF1 to FF36 become the logic level "1". Accordingly, the input data is captured through the scan input terminals SD instead of the data input terminals D in the normal operation. As a result, the input data (the scan test signal) is sequentially captured to the scan flip-flop circuits FF1 to FF36 according to the clock signal CLK.

At this moment, the scan test signal is input through the scan input terminals 12, so that the clock control flip-flop circuit (FFC) 6 of the low speed clock group has the logic level "0" (refer to a signal FFC/D in FIG. 3). During a period of time when the scan enable signal terminals SS have the logic level "0", the scan flip-flop circuits FF1 to FF36 are configured to capture the signal supplied to the data input terminals D thereof at the timing of the clock signal CLK, and output the data from the signal output terminals Q thereof.

In the next step, as shown in FIG. 3, the scan enable terminals SS become the logic level "0", so that the semiconductor integrated circuit 1 is set to the capture operation mode, and the clock signal CLK starts. At this moment, the scan test signal is input to the clock control flip-flop circuit (FFC) 6 of the low speed clock group through the scan input terminals 12, so that the clock control flip-flop circuit (FFC) 6 has the logic level "0". Further, the output terminal Q (the logic level "0") and the scan enable terminal (the logic level "0") of the clock control flip-flop circuit (FFC) 6 are input to the EB signal and the SE signal of the clock gating cell 8. Accordingly, the EB signal and the SE signal of the clock gating cell 8 have the logic level "0".

Further, as indicated with the CG/SE signal and the CG/EB signal shown in FIG. 3, in the capture operation, the transition scan clock control circuit 7 stops the clock output from the clock gating cell 8 of the transition scan clock control circuit 7.

In the embodiment, the output (the logic level "0") of the OR gate 8b of the clock gating cell 8 is input into the latch circuit 8a. Accordingly, as shown in a hidden line A on the CG/GC signal shown in FIG. 3, the clock signal CLK output from the clock gating cell 8 is stopped. At this moment, a signal transition is generated relative to a test subject path of the combination circuit 15 and the combination circuit 17 to be the test subject only from the start point flip-flop circuit of the high speed clock group.

More specifically, as indicated with the clock signal CLK and the clock signal CG/CLK shown in FIG. 3, two pluses of the clock signal CLK (the capture clock signal) having a specific test cycle interval (also referred to as a test reference) are supplied to the test subject of the compression scan circuit 10. As a result, the signal transition is generated in the start point flip-flop circuit of the test subject path according to the first pulse of the capture clock signal. Further, an operational result in the test subject path corresponding to the scan test data is captured into the end point flip-flop circuit according to the second pulse of the capture clock signal.

In the embodiment, while the semiconductor integrated circuit 1 is set to the capture operation mode, the clock signal CLK starts. The output terminal Q of the clock control flip-flop circuit (FFC) 6 is connected to the input terminal D. Accordingly, the output (the logic level "0") of the clock control flip-flop circuit (FFC) 6 is directly input into the input terminal D. As a result, the value of the clock control flip-flop circuit (FFC) 6 does not change. Accordingly, the end point flip-flop circuit is capable of capturing only the signal generated in the test subject path of the high speed clock group after the transition.

In the next step, the scan enable terminal is set to have the logic level "1", so that the semiconductor integrated circuit 1 is set to the scan shift operation mode. After the end point flip-flop circuit captures the signal as described above, the signal is transferred to the scan output terminals 14 through starting the clock signal CLK, thereby expecting the signal. In other words, the scan enable terminal is set to have the logic level "1", so that the test subject path formed of the scan flip-flop circuits FF1 to FF36 is formed once again. Then, the operational result (the test output data) of the test subject path according to the scan test signal thus set is sequentially captured through the scan output terminals 14, thereby expecting the signal thus captured.

In the embodiment, a tester (not shown) is provided for determining a transitional malfunction. The tester is configured to compare the output result with the expected value scan out from the scan flip-flop circuits FF1 to FF36, thereby determining whether the transitional malfunction occurs in the semiconductor integrated circuit 1. When the tester determines that a delay time of the signal thus captured is longer than the test reference (the test cycle) described above, and does not match to the expected value, the tester determines that the delay malfunction occurs in the signal path of the semiconductor integrated circuit 1.

On the other hand, when the capture operation is performed, the clock signal is stopped relative to the scan FFs FF5, FF15, FF16, FF 25 and FF26 belonging to the low speed clock group. Accordingly, the scan FFs FF5, FF15, FF16, FF 25 and FF26 output the value that is input in the scan shift operation before the capture operation. As a result, in the compression scan circuit 10 of the semiconductor integrated circuit 1, it is not necessary to mask the signal of the scan FFs in the group other than the test subject group.

For example, in the semiconductor integrated circuit 1 shown in FIG. 1, the OR gate 17b of the combination circuit 17 is configured to operate at the low speed clock. In the conventional configuration, when the capture operation is performed, the clock signal is not stopped, so that the logic level "1" is captured from the scan FF FF15 arranged at the front stage. Accordingly, it is necessary to mask the scan FF FF25 arranged at the later stage relative to the OR gate 17b.

On the other hand, in the semiconductor integrated circuit 1 in the embodiment of the present invention, the clock signal is stopped in the capture operation as described above. Accordingly, in the capture operation, it is not necessary to start the clock signal relative to the scan FFs in the low clock speed group. As a result, the logic level is fixed to "0" or "1" that is set in the scan shift operation, so that the signal transition is not generated in the test subject path of the low speed clock group. Accordingly, the scan FF FF25 arranged at the later stage of the OR gate 17b does not capture the transited signal, so that it is not necessary to mask the scan FF FF25.

In the embodiment described above, the transition scan clock control circuit 7 is provided as one single component for performing the clock control when the transition scan is performed in the compression scan circuit 10, and the present invention is not limited thereto. Alternatively, when the semiconductor integrated circuit 1 includes more than three clock groups operating different clocks, a plurality of transition scan clock control circuits having a configuration similar to that of the transition scan clock control circuit 7 may be disposed in a number corresponding to the number of the groups.

In the embodiment, when the transition scan test is performed on the combination circuit that becomes the test subject in the low speed clock, the test scan signal is input to the clock control flip-flop circuit (FFC) 6 from the scan input terminals 12, so that the clock control flip-flop circuit (FFC) 6 has the logic level "1". In this state, when the clock signal CLK corresponding to the low speed clock is input from a clock terminal 51, the low speed clock passes through the latch circuit 8a and the selector 55, so that the low speed clock is input into the scan flip-flop circuit belonging to the low speed clock group.

As explained above, in the embodiment, the semiconductor integrated circuit 1 includes the high speed clock operation block (the high speed clock group) and the low speed clock operation block (the low speed clock group). The scan chains are disposed between the high speed clock operation block and the low speed clock operation block. When the semiconductor integrated circuit 1 performs the capture operation during the transition scan test, the transition scan clock control circuit 7 stops the clock signal supplied to the scan FFs in the low speed clock group.

With the configuration described above, when the transition scan test is performed on the scan FFs in the high speed clock group, it is not necessary to mask the signal in the scan FFs in the low speed clock group. As a result, it is possible to detect malfunctions more accurately in the compression scan mode. Further, when the scan test is performed in the compression bypass mode, the number of patterns in the compression bypass is decreased, thereby making it possible to reduce a period of time for performing the transition scan test.

Further, in the embodiment, the clock signal is supplied to the high speed clock operation block and the low speed clock operation block having the different operation frequencies from one single clock signal source. Further, the specific value is set to the clock control flip-flop circuit (FFC) 6 of the transition scan clock control circuit 7 with the scan chains. Further, when the capture operation is performed in the transition scan test, the clock is supplied to the scan FFs of the low speed clock group from outside of the semiconductor integrated circuit 1. Accordingly, it is possible to perform the transition scan test at the high operation frequency and the low operation frequency, respectively, for a shorter period of time. Further, it is not necessary to increase the number of the signal terminals and the pads of the semiconductor integrated circuit 1 for performing the transition scan test.

The disclosure of Japanese Patent Application No. 2011-139593, filed on Jun. 23, 2011, is incorporated in the application by reference.

While the invention has been explained with reference to the specific embodiments of the invention, the explanation is illustrative and the invention is limited only by the appended claims.

What is claimed is:

1. A semiconductor integrated circuit configured so that a transition scan test can be performed thereon, comprising:
   a plurality of logic circuit blocks having different operation frequencies;
   a clock supply unit for supplying a plurality of clock signals having frequencies corresponding to the operation frequencies of the logic circuit blocks from a clock supply source;
   a compression scan circuit including a plurality of scan chains formed of a plurality of flip-flop circuits, a pattern deployment circuit connected to the scan chains on an input side thereof, and a pattern compression circuit; and
   a clock control unit for controlling the clock supply unit to stop supplying the clock signals to specific ones of the flip-flop circuits of the scan chains when a capture operation is performed during a transition scan test,
   wherein said clock control unit includes a clock control flip-flop circuit so that the clock control unit controls the clock supply unit to stop supplying the clock signals to the specific ones of the flip-flop circuits according to a first specific value set to the clock control flip-flop circuit.

2. The semiconductor integrated circuit according to claim 1, wherein said flip-flop circuits are configured to operate when the flip-flop circuits receive the clock signals corresponding to the operation frequencies of the logic circuit blocks from the clock supply unit.

3. The semiconductor integrated circuit according to claim 1, wherein said flip-flop circuits include a first flip-flop circuit disposed at a front stage and a second flip-flop circuit disposed at a later stage, said first flip-flop circuit having a data output terminal connected to a scan data input terminal of the second flip-flop circuit so that it is possible to switch between the capture operation and a scan shift operation.

4. The semiconductor integrated circuit according to claim 1, wherein said flip-flop circuits include a first flip-flop circuit having a data output terminal connected to a signal input terminal of one of the logic circuit blocks, and a second flip-flop circuit having a data input terminal connected to a signal output terminal of another of the logic circuit blocks.

5. The semiconductor integrated circuit according to claim 1, wherein said clock control unit includes a clock gating unit for controlling the clock supply unit to stop supplying the clock signals to the specific ones of the flip-flop circuits when a logic sum of a scan enable signal for enabling the transition scan test and the first specific value has a second specific value.

6. The semiconductor integrated circuit according to claim 1, wherein said clock supply unit is configured to supply a first clock signal to the specific ones of the flip-flop circuits and a second clock signal to other ones of the flip-flop circuits, said first clock signal having a first frequency lower than a second frequency of the second clock signal.

7. The semiconductor integrated circuit according to claim 1, wherein said clock supply unit includes a frequency division circuit for generating one of the clock signals input from the clock supply unit.

* * * * *